(12) United States Patent
Sjöland et al.

(10) Patent No.: US 12,143,116 B2
(45) Date of Patent: Nov. 12, 2024

(54) TIME TO DIGITAL CONVERTER CALIBRATION

(71) Applicant: Telefonaktiebolaget LM Ericsson (publ), Stockholm (SE)

(72) Inventors: Henrik Pia Sjöland, Lund (SE); Mohammed Abdulaziz, Lund (SE); Tony Påhlsson, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 203 days.

(21) Appl. No.: 17/921,698

(22) PCT Filed: Apr. 28, 2020

(86) PCT No.: PCT/EP2020/061771
§ 371 (c)(1),
(2) Date: Oct. 27, 2022

(87) PCT Pub. No.: WO2021/219205
PCT Pub. Date: Nov. 4, 2021

(65) Prior Publication Data
US 2023/0170915 A1    Jun. 1, 2023

(51) Int. Cl.
*H03M 1/10* (2006.01)
*G04F 10/00* (2006.01)

(52) U.S. Cl.
CPC ........ *H03M 1/1028* (2013.01); *G04F 10/005* (2013.01)

(58) Field of Classification Search
CPC ... H03M 1/1042; G04F 10/005; G04F 10/006
USPC .................................................. 341/155, 120
See application file for complete search history.

(56) References Cited

U.S. PATENT DOCUMENTS

| 8,736,384 | B2 | 5/2014 | Ravi et al. |
| 10,097,187 | B2 * | 10/2018 | Doare ................... H03L 7/0814 |
| 2008/0157839 | A1 | 7/2008 | Staszewski et al. |
| 2018/0131380 | A1 | 5/2018 | Mayer |
| 2018/0164748 | A1 * | 6/2018 | Salle ..................... H03L 7/0991 |

OTHER PUBLICATIONS

International Search Report and Written Opinion issued in International Application No. PCT/EP2020/061771 dated Jan. 14, 2021 (11 pages).

(Continued)

*Primary Examiner* — Peguy Jean Pierre
(74) *Attorney, Agent, or Firm* — Rothwell, Figg, Ernst & Manbeck, P.C.

(57) ABSTRACT

A calibration unit and method therein for calibrating a TDC comprised in a digital PLL are disclosed. The TDC receives a signal from a free-running DCO and a reference signal, and measures the time difference between the DCO and reference signals. The calibration unit receives and processes data samples output from the TDC and generates a calibration lookup table in which each TDC output value has a calibration value. The calibration lookup table may be used for post-distortion. For each TDC output level the corresponding calibration value from the lookup table may be added to the output of the TDC for correction.

7 Claims, 10 Drawing Sheets

(56) References Cited

OTHER PUBLICATIONS

Hussein, A. et al., "A 450 fs 65-nm CMOS Millimeter-Wave Time-to-Digital Converter Using Statistical Element Selection for All-Digital PLLs", IEEE Journal of Solid-State Circuits, vol. 53, No. 2, Feb. 2018 (18 pages).

Jiang, W., "ADPLL Design for WiMAX", MSC Thesis, Delft University of Technology, Sep. 18, 2011 (204 pages).

Liao, D. et al., "An 802.11 a/b/g/n Digital Fractional-N PLL with Automatic Linearity Calibration for Spur Cancellation", RMO2C-5, IEEE, 2016 (4 pages).

Learning More About the CppSim Framework, http://ww.ccpsim.com/about_overview.html, Nov. 5, 2019 (2 pages).

* cited by examiner

TIME TO DIGITAL CONVERTER CALIBRATION

CROSS REFERENCE TO RELATED APPLICATIONS

This application is a 35 U.S.C. § 371 National Stage of International Patent Application No. PCT/EP2020/061771, filed Apr. 4, 2020.

TECHNICAL FIELD

Embodiments herein relate to a calibration technique for a Time to Digital Converter (TDC). In particular, they relate to calibrating a TDC comprised in a digital Phase Locked Loop (PLL) in open-loop.

BACKGROUND

There is a need for accurate local oscillator (LO) signals in wireless transceivers. Typically, LO signals are generated using phase locked loops (PLLs). Traditionally analog PLLs have been used, but lately also digital ones. Currently both options are viable, with different pros and cons. A digital PLL has advantages in the absence of an analog loop filter with large area capacitors, and possibility to support advanced digital algorithms to, for instance, speed up frequency hops. An analog PLL on the other hand is much less complex to design and may have excellent performance regarding phase noise. For instance, at very high frequencies or for very low power, the simplicity of an analog PLL makes it an excellent choice. Choosing an analog PLL, however, the possibilities of using digital algorithms to achieve improved performance may be sacrificed.

Regardless of using an analog or digital PLL, a key concern is how to achieve sufficiently low phase noise with limited power consumption and chip area, without sacrificing any other aspect. While traditional PLL architectures using phase-frequency detectors and charge pumps are well proven in applications, digital PLLs typically rely on a time-to-digital converter (TDC) to measure the phase error so that the PLL can form a control signal.

TDCs tend to consume a substantial part of the power in a digital PLL. Depending on PLL architecture they need to measure signal timing over an interval that is typically at least one output signal cycle. To achieve a low in-band PLL phase noise, the timing resolution for a TDC is often required to be less than one inverter delay, preventing a straightforward implementation of a TDC with a single delay line of inverters. The thermal and 1/f noise must also be low, which is difficult to realize with long delay lines. The linearity must be high when operating in fractional-N mode, i.e. when generating output frequencies that are non-integer multiples of the reference in the PLL, since non-linearities result in so-called fractional spurs. The fractional spurs may end up at frequencies close to a carrier, and then they may be relatively strong, causing problems with a transceiver to receive or transmit signals at these unintended frequencies. High linearity means that the matching accuracy must be high between delay line cells, calling for increased physical sizes. Therefore a TDC must have high performance, low noise and high resolution to minimize phase noise, and high linearity to minimize spurs. It should be clear that achieving a high performance TDC with low power consumption is a major challenge in digital PLL design.

Some calibration techniques have been presented for improving TDC linearity, relaxing its design. In D. Liao, et al. "An 802.11 a/b/g/n digital fractional-N PLL with automatic TDC linearity calibration for spur cancellation", IEEE RFIC Symposium, 2016, and in U.S. Pat. No. 8,736,384B2, a closed loop TDC calibration technique is presented which requires longer calibrating time. More improvements on TDC calibration are needed.

SUMMARY

Therefor it is an object of embodiments herein to provide an improved calibration technique for TDC comprised in a Phase Locked Loop (PLL).

According to a first aspect of embodiments herein, the object is achieved by a calibration unit and method therein for calibrating a Time to Digital Converter (TDC). The TDC is configured to receive a signal with reference frequency $F_{REF}$ and a signal from a Digital Controlled Oscillator (DCO) with frequency $F_{DCO}$.

The calibration unit receives output data samples from the TDC for a predefined period of time.

The calibration unit performs a de-wrapping process on the data samples.

The calibration unit generates reference line segments from the data samples using a numerical fitting method.

The calibration unit calculates an error value for each of the output data samples associated to a TDC output level by calculating a deviation of each output data sample from a corresponding reference level of at least one reference line segment;

The calibration unit accumulates the error values of the data samples associated to a TDC output level in an accumulator of this TDC output level;

The calibration unit increases a counter value of a TDC output level by one when an error value of a data sample associated with this TDC output level is added to its accumulator.

The calibration unit averages the error values for each TDC output level by dividing the accumulated error value for each TDC output level in its accumulator by its counter value.

The calibration unit generates a calibration lookup table comprising an error vector of the averaged error values for the TDC output levels.

According to a second aspect of embodiments herein, the object is achieved by a calibration unit and method therein for calibrating a Time to Digital Converter (TDC). The TDC is configured to receive a signal with reference frequency $F_{REF}$ and a signal from a Digital Controlled Oscillator (DCO) with frequency $F_{DCO}$. The DCO frequency $F_{DCO}$ is set to close to an integer multiple of the reference frequency $F_{REF}$ such that a number of ramps of output data samples from the TDC are generated.

The calibration unit receives output data samples from the TDC for a predefined period of time;

The calibration unit detects borders between ramps by observing if an output data sample has a large and abrupt transition compared to previous output data sample.

For each ramp of the TDC output data samples, the calibration unit generates a reference line for the ramp using a numerical fitting method.

The calibration unit calculates an error value for each of the output data samples associated with a TDC output level by calculating a deviation of each output data sample in a ramp from a corresponding reference level of the reference line of this ramp.

The calibration unit accumulates the error values of the data samples associated with a TDC output level in an accumulator of this TDC output level;

The calibration unit increases a counter value of a TDC output level by one when an error value of a data sample associated with this TDC output level is added to its accumulator;

When the ramps of the output data samples have been analyzed and the accumulators and counters have been updated, the calibration unit averages the error values for each TDC output level by dividing the accumulated error value for each TDC output level in its accumulator by its counter value.

The calibration unit generates a calibration lookup table comprising an error vector of the averaged error values for the TDC output levels.

The embodiments herein provide calibration techniques that work with a digital PLL in open-loop. The TDC receives a signal from a free-running DCO and a reference signal, and measures the time difference between the DCO and reference signal edges. Since the reference frequency $F_{REF}$ and the DCO frequency $F_{DCO}$ are not phase locked, a sawtooth-like output data samples from the TDC representing the phase or time difference between the two signals is observed.

There are two options for performing the open-loop calibration. One is to perform a de-wrapping process as described in the first aspect of embodiments herein, i.e. the data samples are processed to form a ramp of output levels. In this case, the gain of the TDC or the de-wrapping step needs to be estimated. This may be done by estimating TDC output level difference for a time period corresponding to one DCO cycle, and then adding or subtracting a staircase function with the estimated TDC output level difference to the data samples, so that a sawtooth shape of the output data samples are converted to a single ramp with all the output data samples. By de-wrapping the output data samples and comparing them to one or more reference line segments, the error can be estimated for each data sample.

In another option of performing the open-loop calibration, as described in the second aspect of embodiments herein, de-wrapping process is not needed. The DCO frequency is then set to be closer to an integer multiple of the reference frequency. This will generate longer ramps directly at the output of the TDC. The benefit of using this scheme is that by avoiding the de-wrapping process, one does not need to estimate the gain of the TDC, and one can use the raw TDC output data samples directly. For each ramp, the data samples are compared to a reference line of this ramp and error values for the output data samples in this ramp are calculated. After all ramps of data samples have been processed, the error values for each TDC output value are averaged for better accuracy. As a result, a calibration lookup table comprising an error vector of the averaged error values for the TDC output levels is generated. The calibration lookup table may then be used either for digital corrections, i.e. post distortion, or for calibrating the TDC by programming for instance node capacitances or bias currents of the TDC.

The calibration techniques according to embodiment herein have some advantages:

The calibration techniques are open loop so they are fast.

Calibration may be performed at the lowest DCO frequency and can then calibrate the full TDC range needed in PLL operation.

There is no interaction from the PLL that affects the calibration result because of open loop during calibration.

Allowing DCO frequency drift by splitting data samples into a series of independent line fittings.

Therefore, the embodiments herein provide an improved calibration technique for TDC comprised in a Phase Locked Loop (PLL).

BRIEF DESCRIPTION OF THE DRAWINGS

Examples of embodiments herein are described in more detail with reference to attached drawings in which.

DETAILED DESCRIPTION

Figure 1:
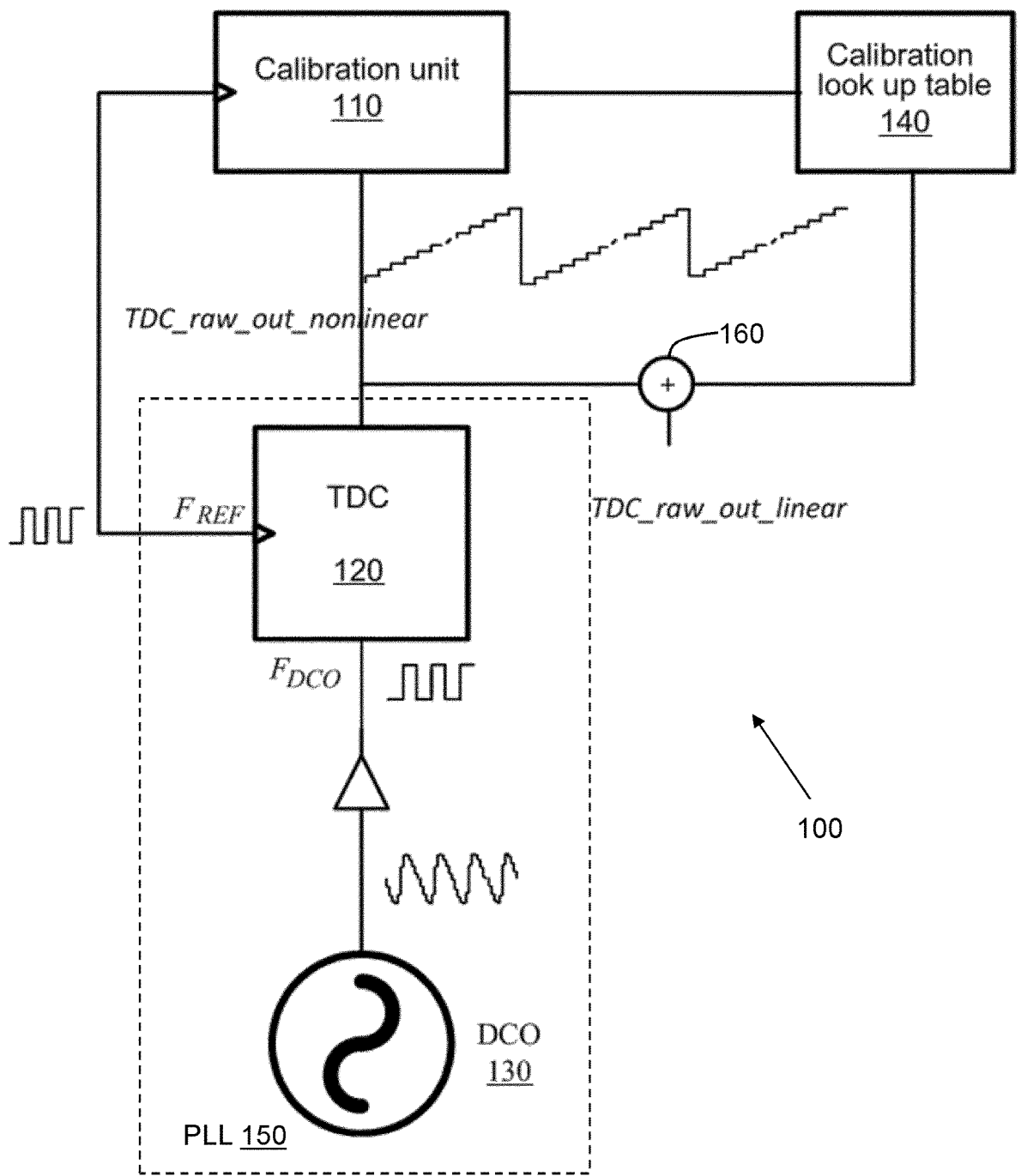
FIG. 1 is a schematic block view of a calibration system according to embodiments herein.

FIG. 1 shows a calibration system 100 for calibrating a TDC according to embodiments herein. As seen from FIG. 1, the calibration system 100 comprises a calibration unit 110 for calibrating a TDC 120 comprised in a digital PLL 150. The digital PLL 150 further comprises a DCO 130. The DCO 130 is free running and excites the TDC 120. The digital PLL 150 is assumed divider-less, so that the DCO 130 is connected directly to the TDC 120, which is popular to eliminate the divider power consumption and potential phase noise increase. There is, however, nothing in the TDC calibration techniques that excludes a PLL architecture using a frequency divider. To keep the figure simple, the divider could in that case be assumed to be included in the DCO 130 block, and other parts, e.g. a loop filter of the PLL are not shown in FIG. 1. The TDC 120 receives a reference signal with reference frequency $F_{REF}$ and a signal from the DCO 130 with frequency $F_{DCO}$.

With the DCO 130 set at a constant frequency, preferably at one of its lowest, the output of the TDC 120 is monitored. The TDC 120 measures the time or phase difference between edges of the reference signal and the signal from the free-running DCO 130. Both signals are nearly constant in frequency, especially the reference signal, whereas the DCO 130 will have some more drift. Since the reference frequency $F_{REF}$ and the DCO frequency $f_{DCO}$ are not phase locked, the time difference between edges of the two signals will then develop linearly over time due to the fixed frequency difference. A sawtooth-like shape with output data samples is observed from the TDC 120 output TDC_raw_out_nonlinear, where each data point represents a linearly increasing or decreasing time difference sampled at the reference frequency rate. When the phase difference exceeds one period of the DCO frequency or becomes negative, another edge of the DCO will come into the TDC measurement range, and the output will change abruptly by an amount corresponding to one DCO period. There will then be wrap-around for the TDC output levels, hence the sawtooth shape of the signal is generated. So when monitoring the TDC output for a predefined period of time, a number of ramps with output data samples are observed, as shown in FIG. 1 at the output TDC_raw_out_nonlinear of TDC 120 and which is further shown in FIG. 2.

If $F_{DCO}$ is close to an integer multiple of the $F_{REF}$, then the majority of the TDC output levels will be excited in each ramp. This is desirable since one can gather more TDC output levels from each ramp, without the need for de-wrapping, and after several ramps, many error estimates for each TDC output level may then be calculated. The error estimates for each TDC output level are then averaged for higher accuracy. The averaged error estimates for each TDC output level may be stored in a calibration lookup table 140, which may be used for post-distortion. For each TDC output level the corresponding calibration value from the lookup table 140 is added to the output of the TDC for correction. This is indicated in FIG. 1 by a summation unit 160 yielding a calibrated output TDC_raw_out_linear.

There are different options for performing the open-loop calibration. One is to perform a de-wrapping process on the output data samples from the TDC 120. One is to perform the calibration without de-wrapping process on the output data samples from the TDC 120.

Figure 3:
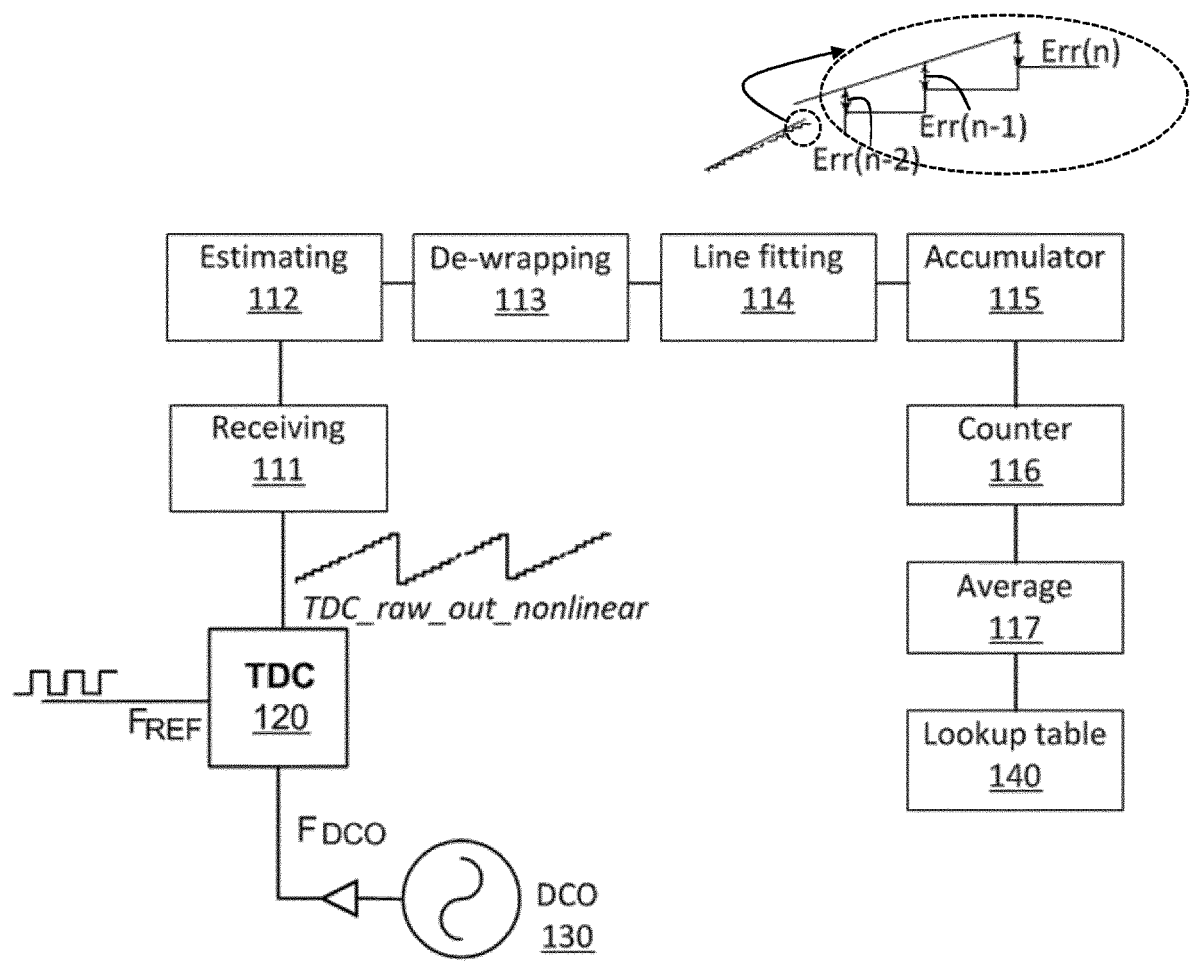
FIG. 3 is a block diagram illustrating block functions of a calibration unit according to embodiments herein.
Figure 4:
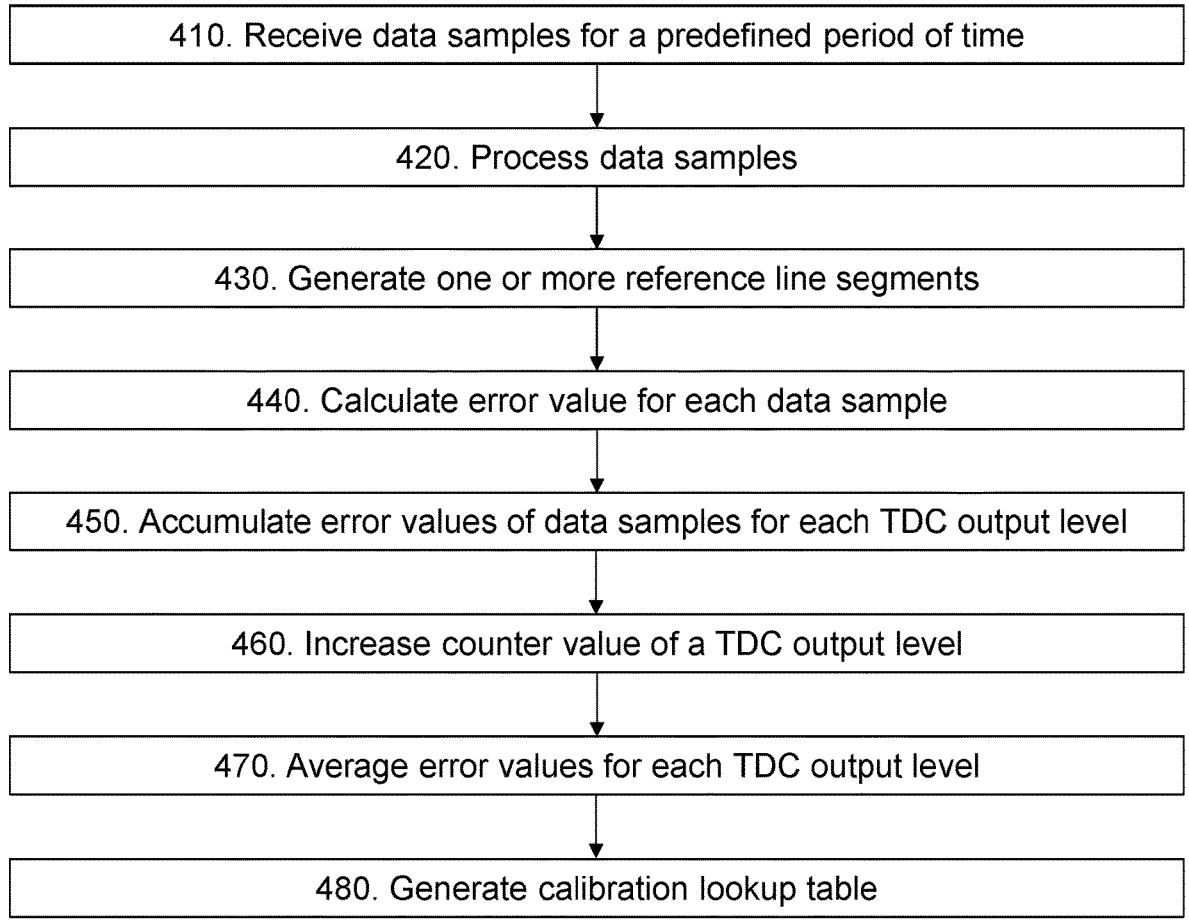
FIG. 4 is a flow chart of a calibration method according to one embodiment herein.

According to one embodiment herein, a method performed in the calibration unit 110 for calibrating the TDC 120 with de-wrapping process on the output data samples from the TDC 120 will be described with reference to FIG. 3 and FIG. 4. FIG. 3 is a block diagram illustrating block functions of the calibration unit 110 and FIG. 4 is a flow chart of the calibration method. The calibration unit 110 comprises a receiving unit 111, an estimating unit 112, a de-wrapping unit 113, a line fitting unit 114, an accumulator unit 115, a counter unit 116 and an average unit 117. The method comprises the following actions.

Action 410

The calibration is performed by first gathering the TDC 120 output data samples in the receiving unit 111. The calibration unit 110 receives output data samples from the TDC 120 for a predefined period of time. As described above, the TDC 120 receives a signal with reference frequency $F_{REF}$ and a signal from the DCO 120 with frequency $F_{DCO}$, measures the time or phase difference between edges of the two signals and outputs data samples.

Action 420

The calibration unit 110 performs a de-wrapping process on the data samples in the estimating unit 112 and the de-wrapping unit 113.

Figure 5:
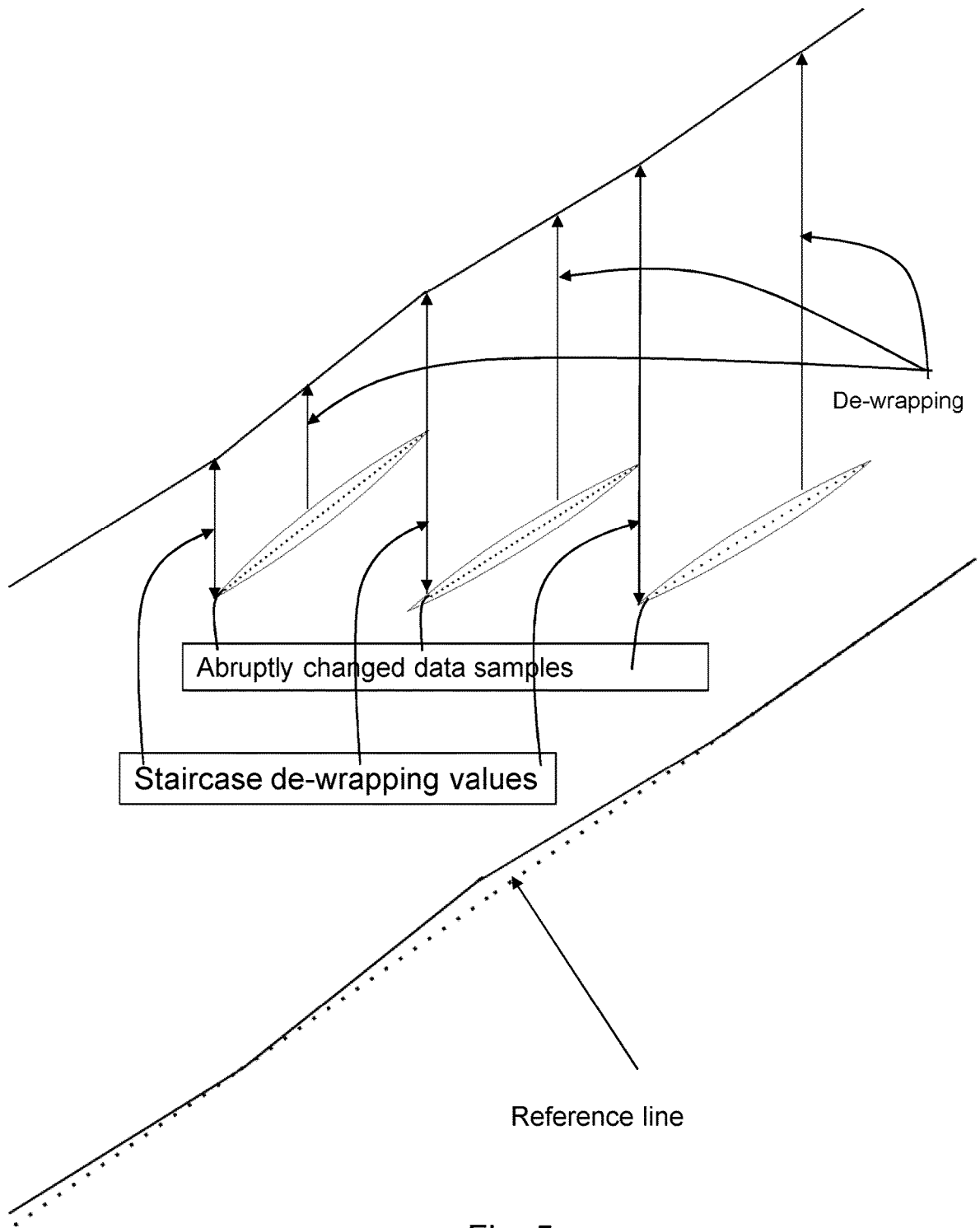
FIG. 5 is a diagram showing a de-wrapping process according to embodiments herein.

This action performs a de-wrapping process on the output data samples from the TDC 120. To perform the de-wrapping process, accurate estimation of TDC de-wrapping step, i.e. the TDC gain, is needed. This may be done by estimating a TDC output level difference for a time period corresponding to one DCO cycle, and then adding or subtracting a staircase function with a step-size equal to the estimated TDC output level difference to the data samples. That is staircase de-wrapping steps associated with the estimated TDC output level difference are placed at samples where the value changes abruptly due to phase wrapping. For example, a first de-wrapping value which equals to the estimated TDC gain is added to a first data sample where its value changes abruptly and to the data samples after the first data sample until the next data sample where its value changes abruptly. A second de-wrapping value which equals to 2 times of the estimated TDC gain is added to this next data sample, i.e. a second data sample where its value changes abruptly and to the data samples after the second data sample until the next sample where its value changes abruptly, and so on. The data samples are thereby de-wrapped, so that the value difference between each data sample and its next data sample becomes close to constant. This de-wrapping process is illustrated in FIG. 5, where the output data samples, the staircase de-wrapping values, data samples where its value changed abruptly are visualized for easy understanding. It can be seen, after de-wrapping process, the sawtooth shape of the output data samples is converted to a single ramp of data samples.

One method to accurately estimate the TDC 120 gain may be to minimize the estimated average squared error for the data samples over a few reference line segments, by adjusting the de-wrapping step size. When the squared error is minimum, the TDC gain or de-wrapping step size is correctly estimated, and the de-wrapping process will then introduce minimum deviations from the reference line segments. Performing this estimation requires some calculations, but on the other hand the DCO 130 frequency does not need adjustment close to an integer multiple of the reference frequency $F_{REF}$.

Action 430

The calibration unit 110 generates in the line fitting unit 114 one or more reference line segments from the data samples using a numerical fitting method. For example, the sum of least squares method may be used to calculate one or more reference line segments, and each reference line segment comprises a perfectly linear response fitted to the actual TDC output for a time interval. The reference line segment may be characterized by the parameters in a mathematical equation. For instance it may use the starting point and the end point of the line, from which points in between are interpolated. Alternatively, it may use one point, e.g. start, middle, or end point, the slope of the line, and possibly also the length of the line indicating where evaluation is to be performed. In some embodiments, other parameters may be used to characterize the reference line segment as well. For instance, any two points on a line segment may be used, or any single point together with a parameter indicating a slope. For a sample time within the valid interval of the line, it is then possible to calculate the value of the line, using the equation of the line and the parameters found by the numerical fitting method.

Action 440

The calibration unit 110 calculates an error value for each of the output data samples associated to a TDC output level by calculating a deviation of each output data sample from a corresponding reference level of at least one reference line segment. For example, as shown in FIG. 3, the error values Err(n), Err(n−1), Err(n−2) . . . are calculated for the output levels TDC_out(n), TDC_out(n−1), TDC_out(n−2) . . . as a difference between the output levels and the references line respectively. Each TDC output level has a number of data samples, and each data sample has an associated TDC output level. In order to increase the accuracy of the calibration, the number of data samples associated to each TDC output level should be high enough.

By de-wrapping the data samples and fitting them to a reference line, the errors of the TDC can be estimated for each output data sample.

To allow for some drift in the DCO frequency, the reference line may be broken into shorter segments that may have different slopes, i.e. frequency differences. As long as the DCO frequency drift during one segment is low, the assumption that the TDC output should ideally follow a line holds, and the deviations from the line can be properly detected.

Action 450

The calibration unit 110 accumulates in the accumulator unit 115 the error values of the data samples associated to a TDC output level in an accumulator of this TDC output level. Each TDC output level has its own accumulator in the accumulator unit 115. The error values calculated in Action 440 for the data samples associated with a TDC output level are accumulated for this TDC output level. The accumulated error vector is reset to zero at the beginning of each calibration.

Action 460

The calibration unit 110 increases in the counter unit 116 a counter value of a TDC output level by one when an error value of a data sample associated with this TDC output level is added to its accumulator. Each TDC output level has its own counter in the counter unit 116.

Action 470

The calibration unit 110 averages in the average unit 117 the error values for each TDC output level by dividing the accumulated error value for each TDC output level in its accumulator by its counter value.

Action 480

The calibration unit 110 generates a calibration lookup table comprising an error vector of the averaged error values for the TDC output levels. In the calibration lookup table, each TDC output value has a calibration value.

The error vector in the calibration lookup table can be used for post distortion. The correction may be applied by a simple summation in the summation unit 160 as shown in FIG. 1. If the calibration is performed at the lowest DCO frequency, where the DCO cycle is longest, the TDC will be calibrated over the widest range that may occur during operation. Then the calibration will be valid for all other higher DCO frequencies. The error vector in the calibration lookup table may also be used for calibrating the TDC by programming for instance node capacitances or bias currents of the TDC.

As shown in FIG. 3, to perform the calibration method described above with Actions 410-480, the calibration unit 110 comprises an estimating unit 111, a de-wrapping unit 112, a line fitting unit 113, an accumulator unit 114, a counter unit 115 and an average unit 116.

The calibration unit 110 is configured to receive output data samples from the TDC for a predefined period of time.

The calibration unit 110 is configured to, by means of the estimating unit 111 and de-wrapping unit 112 being configured to, perform a de-wrapping process on the data samples.

The calibration unit 110 is configured to, by means of the line fitting unit 113 being configured to, generate reference line segments from the data samples using a numerical fitting method and calculate an error value for each of the output data samples associated to a TDC output level by calculating a deviation of each output data sample from a corresponding reference level of at least one reference line segment of.

The calibration unit 110 is configured to, by means of the accumulator unit 114 and counter unit 115 being configured to, accumulate the error values of the data samples associated to a TDC output level in an accumulator of this TDC output level and increase a counter value of a TDC output level by one when an error value of a data sample associated with this TDC output level is added to its accumulator.

The calibration unit 110 is configured to, by means of average unit 116 being configured to, average the error values for each TDC output level by dividing the accumulated error value for each TDC output level in its accumulator by its counter value.

The calibration unit 110 is configured to generate a calibration lookup table comprising an error vector of the averaged error values for the TDC output levels.

Another option is to perform the calibration without de-wrapping process on the output data samples from the TDC 120. The DCO frequency then typically has to be adjusted, in exchange for not having to estimate the de-wrapping step size. The DCO frequency may be set to be closer to an integer multiple of the reference frequency, i.e. $F_{DCO} \sim N*F_{REF}$ but $F_{DCO} \neq N*F_{REF}$. This will provide longer output ramps from the TDC without need for de-wrapping. The closer the DCO frequency is to a multiple of the reference frequency, more output levels of the TDC will be excited, the longer the ramps. That is the closeness to an integer relates to the number of data samples in each ramp, the closer it is, the larger number of data samples in each ramp. For instance if the fractional part of the frequency ratio is 0.05 there will be about 1/0.05=20 data samples per ramp. Depending on the DCO structure, the frequency can be set by e.g. a capacitor bank or setting a current in a ring oscillator. The benefit of using this scheme is that by avoiding the de-wrapping process, one does not need to estimate the gain of the TDC, and one can use the raw TDC output data samples directly.

Figure 6:
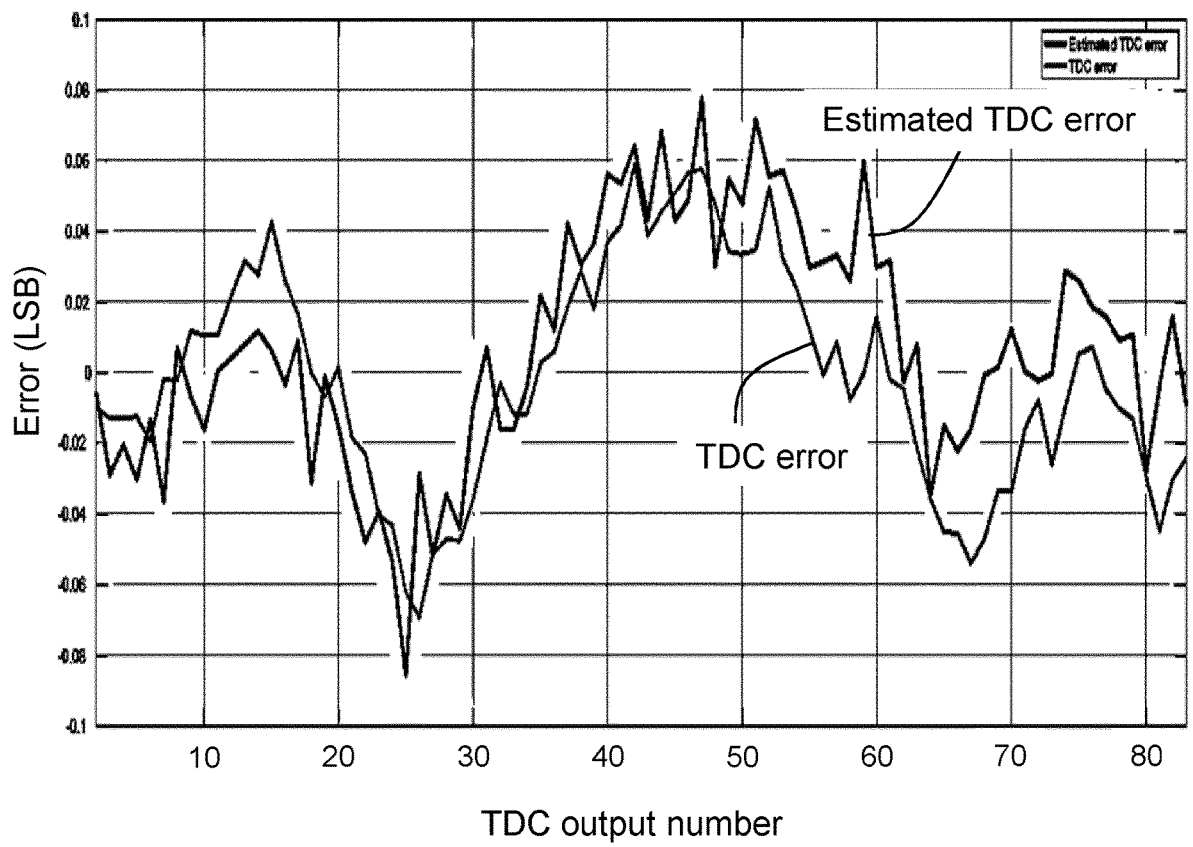
FIG. 6 is a diagram showing simulation results on actual and estimated TDC output error.

The number of excited TDC output levels for a certain performance may be seen in FIG. 6. FIG. 6 shows simulation results on actual and estimated TDC output integral nonlinearity (INL) errors for $F_{REF}$=200 MHz and $F_{DCO}$=5799 MHz, with TDC resolution 2 pS, and calibration time 100 μS. Each output level has in average 64 data samples. As can be seen the proposed calibration technique can accurately estimate also very small errors after 64 readings of data samples for each output level in a total time of less than 100 μS.

The number of TDC levels is dependent on the TDC resolution and the range that the TDC covers. A finer resolution and a larger range lead to more required TDC output levels.

For example, a reference frequency $F_{REF}$ of 200 MHz has a clock period of 5 ns. In a calibration time of 100 us, there will be totally 20000 reference clock cycles in this time, i.e. the TDC 120 can produce 20000 output data samples. With a DCO-cycle of approximately 172 ps, it will reach 172 ps/2 ps=86 of the TDC output levels. In average it will get 20000/86≤233 data samples per TDC output level.

The TDC output will only shift and produce a new output level when the phase drift between the DCO and the reference signal has shifted enough to reach a new level of the discrete output levels of the TDC. The frequency ratio in FIG. 6 is 5799/200=28.995, which gives a phase or time difference 0.005*DCO-cycle, i.e. 0.005*1/5799 MHz=0.005*172.44 ps=0.8622 ps. The resolution of the TDC is 2 ps. This means that the TDC will in average stay at each output level for 2 ps/0.8622 ps=2.3196 reference cycles. In this case the choice of DCO frequency is good, and the TDC run through 20000/(2.3196*86)≈100 ramps in the calibration time. To get a good performance and accuracy it is good if the TDC runs through at least 10 ramps.

Figure 7:
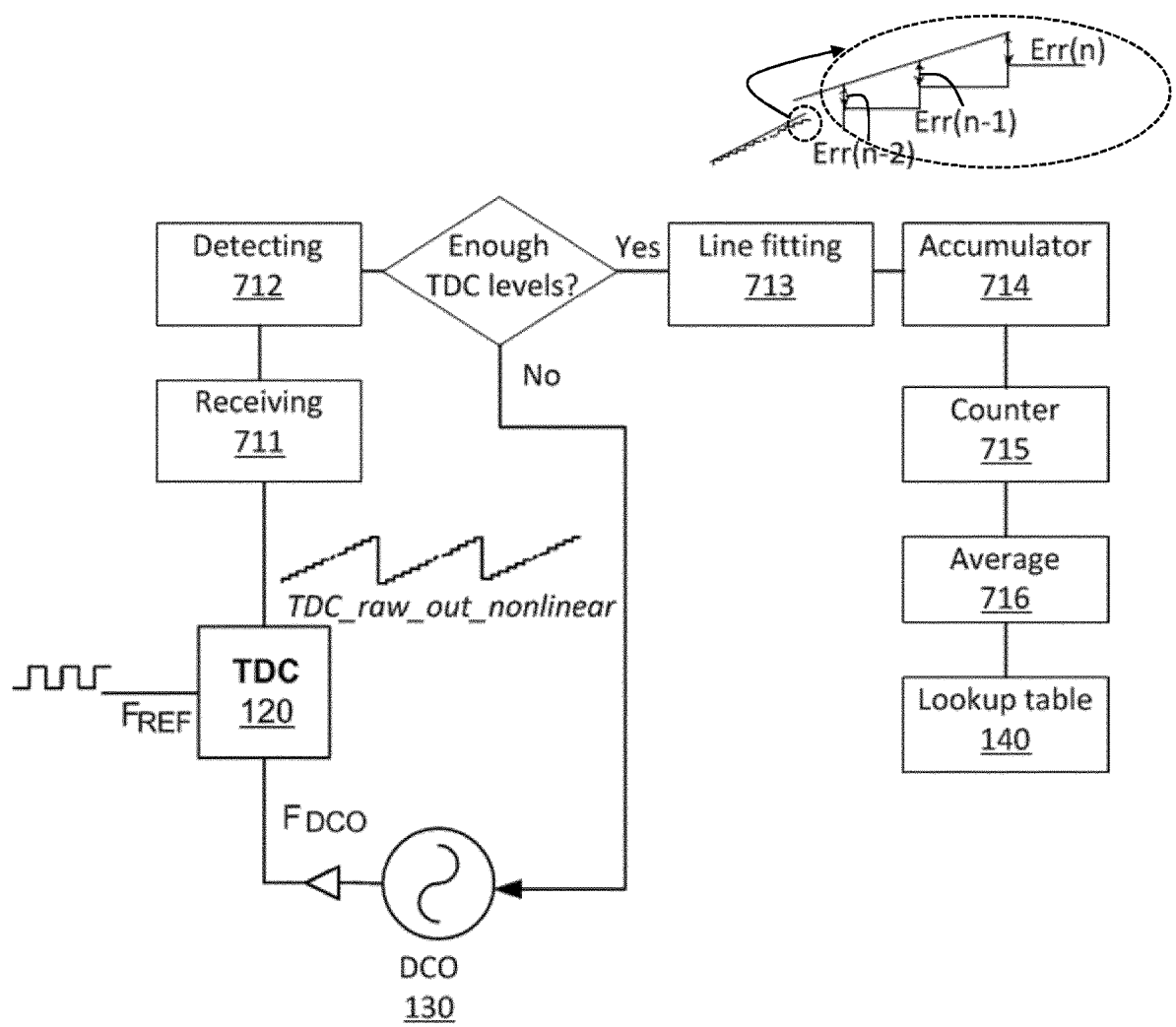
FIG. 7 is a block diagram illustrating block functions of a calibration unit according to embodiments herein.
Figure 8:
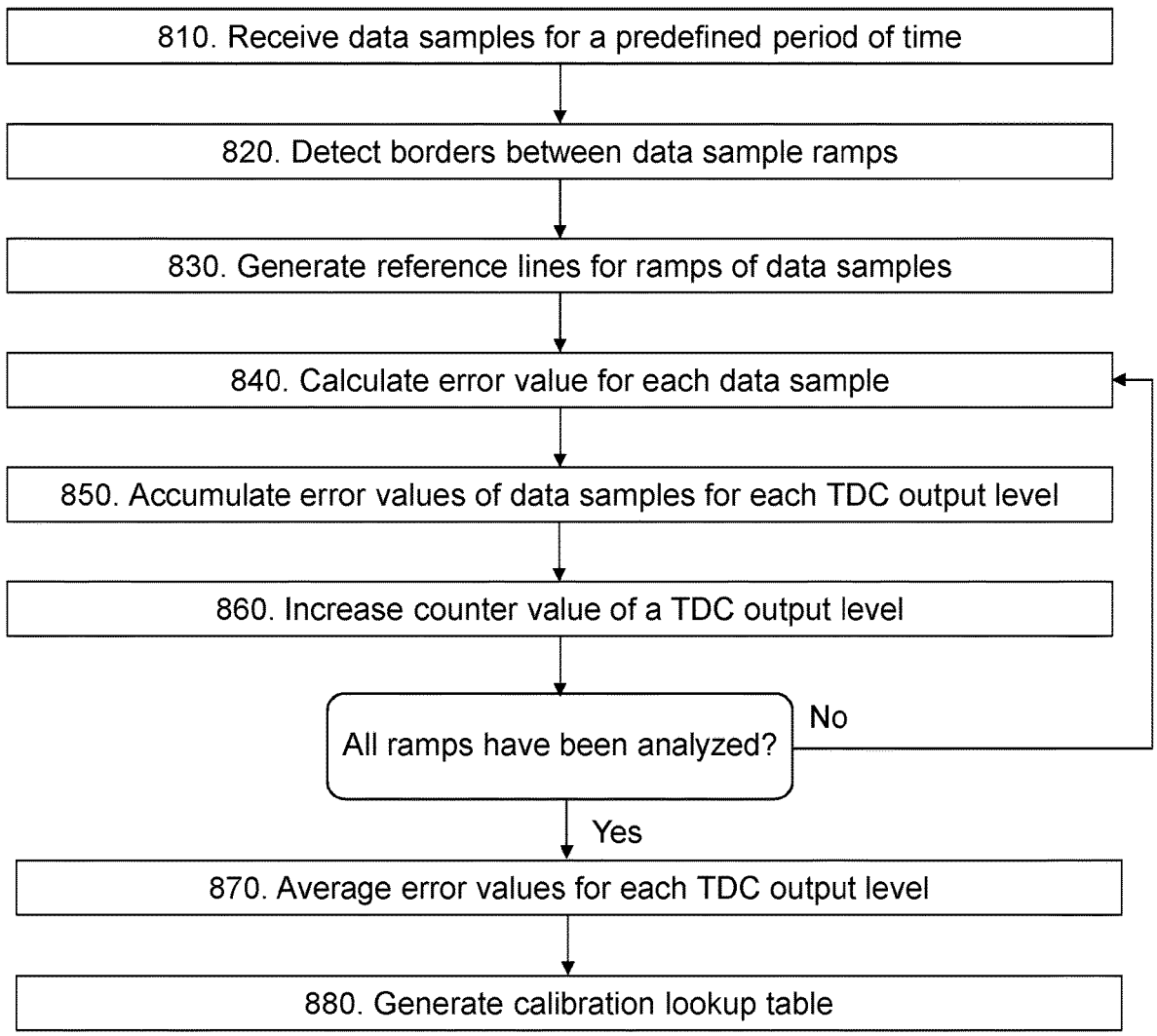
FIG. 8 is a flow chart of a calibration method according to another embodiment herein.

A method performed in the calibration unit 110 for calibrating the TDC 120 without de-wrapping process on the output data samples from the TDC 120 will be described with reference to FIG. 7 and FIG. 8. FIG. 7 is a block diagram illustrating block functions of the calibration unit 710 and FIG. 8 is a flow chart of the calibration method. The calibration unit 110 comprises a receiving unit 711, a detecting unit 712, a line fitting unit 713, an accumulator unit 714, a counter unit 715 and an average unit 716. The method comprises the following actions.

Action 810

The calibration is performed by first gathering the TDC output data samples. The calibration unit 110 receives by the receiving unit 711 output data samples from the TDC 120 for a predefined period of time. As seen in FIG. 7, the TDC 120 receives a signal with reference frequency $F_{REF}$ and a signal from a DCO 130 with frequency $F_{DCO}$. The DCO frequency $F_{DCO}$ is set to close to an integer multiple of the reference frequency $F_{REF}$ such that ramps of output data samples from the TDC 120 are generated, which is visualized in FIG. 7 as TDC_raw_out_nonlinear.

Action 820

The calibration unit 110 detects in the detecting unit 712 borders between ramps by observing if an output data sample has a large and abrupt transition compared to previous output data sample. In this case the wrap-around detection can for example be triggered by a large jump in the output of the TDC. When the wrap-around detection is triggered the sample and the succeeding ones are treated as belonging to a new ramp of data samples. In this way, the data samples are partitioned into ramps based on the detected borders.

The data samples gathered in one ramp are checked to see if a sufficient number of samples are present. If not, then the DCO frequency needs to be adjusted to be close to an integer multiple of the reference frequency $F_{REF}$. From simulations, a value in the interval $N*F_{REF} \pm F_{REF}*5\%$ is enough to accurately estimate the TDC output error, but note that the frequency of the DCO should not be exactly at an integer multiple of the reference frequency, since in that case the output from the TDC would be stationary and not a ramp.

Action 830

Figure 2:
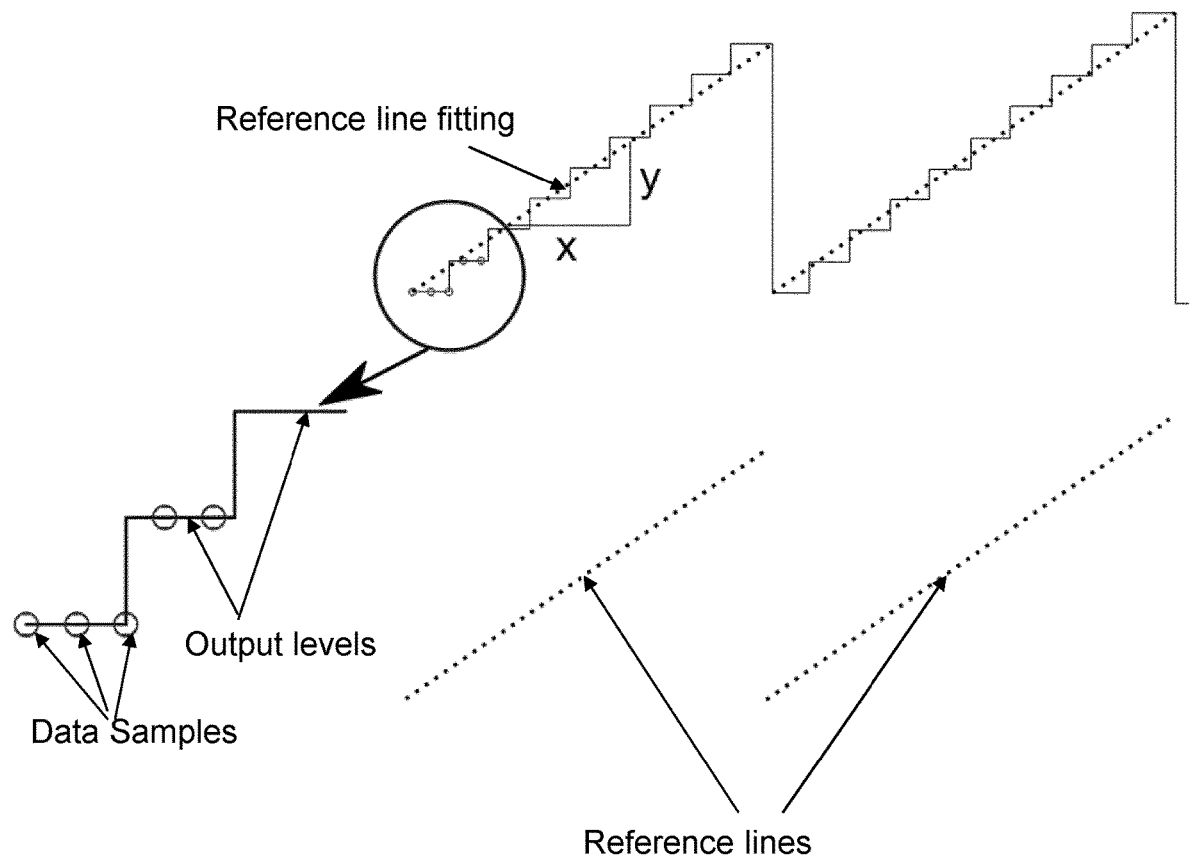
FIG. 2 is a diagram showing an example of output data samples from a TDC.

For each ramp of the TDC output data samples, the calibration unit 110 generates in the line fitting unit 713, a reference line for the ramp using a numerical fitting method, as shown in FIG. 2, where the output data samples, TDC output levels, reference lines, reference line fitting are visualized. Each reference line consists of a ramp of reference output levels representing a perfectly linear output of the TDC. In this way, one reference line per exited ramp is made. The reference line may be characterized by the parameters in a mathematical equation similarly as discussed above in Action 430.

Action 840

The calibration unit 110 calculates in the line fitting unit 713 an error value for each of the output data samples associated with a TDC output level by calculating a deviation of each output data sample in a ramp from a corresponding reference level of the reference line of this ramp.

Action 850

The calibration unit 110 accumulates in the accumulator unit 714 the error values of the data samples associated with a TDC output level in an accumulator of this TDC output level. Each TDC output level has its own accumulator in the accumulator unit 714. The error values calculated for the data samples associated with a TDC output level are accumulated for this TDC output level. In other words, an error vector for all TDC output levels is obtained, having one entry per TDC output level. This error vector is accumulated. The accumulated error vector is reset to zero at the beginning of each calibration.

Action 860

There is also a corresponding vector of counters, i.e. the counter unit 815, one for each TDC output level that is reset to zero at the beginning of each calibration. The calibration unit 110 increases a counter value of a TDC output level by one when an error value of a data sample associated with this TDC output level is added to its accumulator. That means each TDC output level has its own counter in the counter unit 815. When the accumulators are updated with the error values from one ramp, the corresponding counters are also updated.

Action 870

When the ramps of the output data samples have been analyzed and the accumulators and counters have been updated, the calibration unit 110 averages the error values for each TDC output level by dividing the accumulated error value for each TDC output level in its accumulator by its counter value. This action is performed once enough error values for each output level are recorded. By enough error values it is the required accuracy set by the user or the minimum number of readings for each level.

Action 880

The calibration unit 110 generates a calibration lookup table comprising an error vector of the averaged error values for the TDC output levels. In the calibration lookup table, each TDC output value has a calibration value.

As shown in FIG. 7, to perform the calibration actions 810-880, the calibration unit 710 comprises a detecting unit 712, a line fitting unit 713, an accumulator unit 714, a counter unit 715 and an average unit 716.

The calibration unit 710 is configured to receive output data samples from the TDC for a predefined period of time.

The calibration unit 710 is configured to, by means of the detecting unit 712 being configured to, detect borders between ramps by observing if an output data sample has a large and abrupt transition compared to previous output data sample.

For each ramp of the TDC output data samples, the calibration unit 710 is configured to, by means of the line fitting unit 713 being configured to, generate a reference line for the ramp using a numerical fitting method and calculate an error value for each of the output data samples associated with a TDC output level by calculating a deviation of each output data sample in a ramp from a corresponding reference level of the reference line of this ramp.

The calibration unit 710 is configured to, by means of the accumulator unit 714 and counter unit 715 being configured to, accumulate the error values of the data samples associated with a TDC output level in an accumulator of this TDC output level and increase a counter value of a TDC output level by one when an error value of a data sample associated with this TDC output level is added to its accumulator.

When the ramps of the output data samples have been analyzed and the accumulators and counters have been updated, the calibration unit 710 is configured to, by means of the average unit 716 being configured to, average the error values for each TDC output level by dividing the accumulated error value for each TDC output level in its accumulator by its counter value.

The calibration unit 710 is configured to generate a calibration lookup table comprising an error vector of the averaged error values for the TDC output levels.

Figure 9:
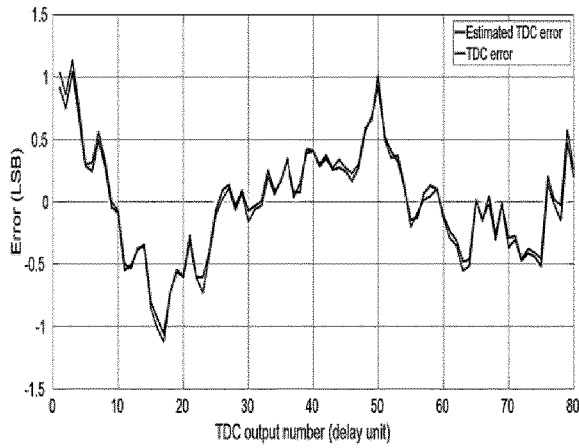
FIG. 9 are diagrams showing simulation results on actual and estimated TDC output errors as well as residue error.
Figure 9:
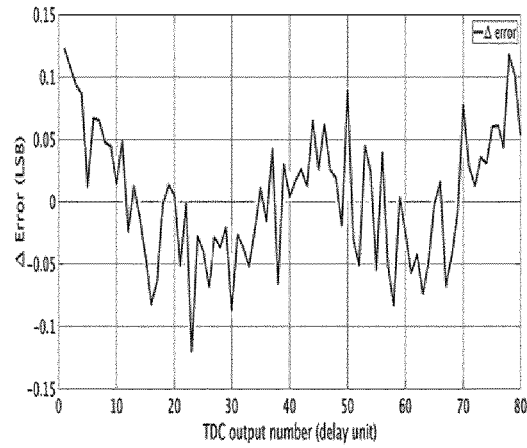
Figure 9:
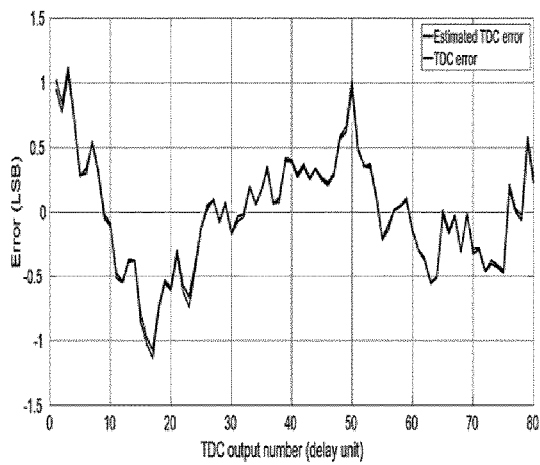
Figure 9:
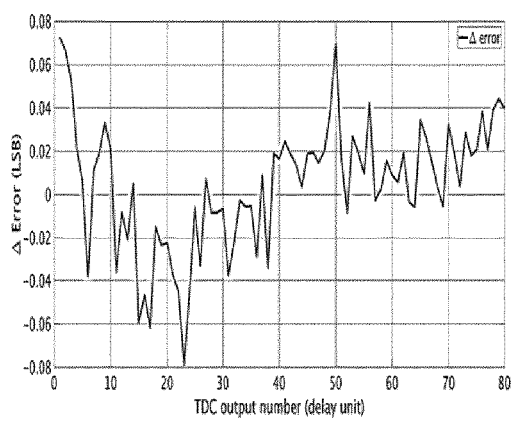
Figure 9:
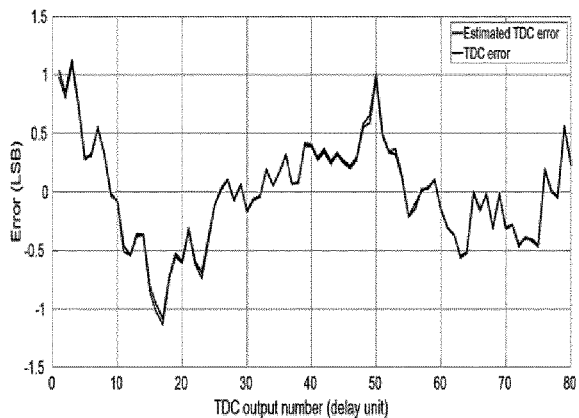
Figure 9:
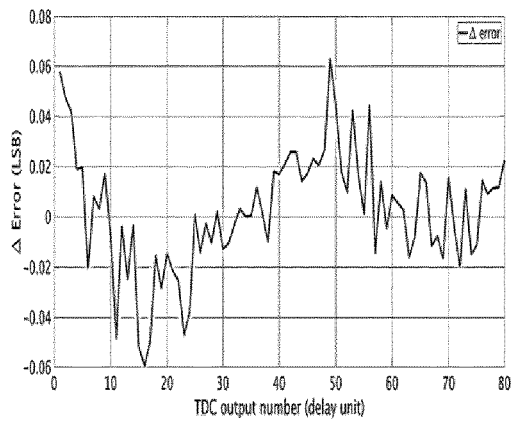

Although the calibration algorithms according to embodiments herein work well to detect very small errors if given time, it is also important to be able to account for larger errors in a shorter time. Therefore, for the same simulation example as before, the integral nonlinearity (INL) error is increased to ±1 Least Significant Bit (LSB) to see how fast the calibration algorithms can detect it and still produce acceptable results. Running the TDC for 10, 50 and 100 μS, the estimated error and the actual error (diagrams to the left), as well as the error residue (diagrams to the right), i.e. the post correction error are shown in FIG. 9. As can be seen in FIG. 9, within 10 μS the error residue is about ±0.1 LSB, as shown in the upper diagram to the right. It can also be seen that the estimated error improves when running the TDC calibration for a longer period of time. For example, within 50 μS, the error residue is about ±0.08 LSB, as shown in the middle diagram to the right, and within 100 μS, and the error residue is about ±0.06 LSB, as shown in the bottom diagram to the right.

To summarize, by performing the calibration at a low DCO frequency, or at the very lowest DCO frequency, the maximum DCO cycle time can be obtained, the TDC range corresponding to the DCO period will be calibrated and the TDC is then calibrated over the full timing range that may be needed during PLL operation. By performing the calibration in open loop, high speed calibration and yet accurate estimation of the error is achieved, as there is no need to wait for the loop to settle before the calibration can start. Furthermore, by keeping the DCO control voltage fixed during calibration, the loop will not affect the calibration result, and one can directly measure the TDC output errors without interaction from the PLL. These are some advantages over prior art solutions with the closed loop TDC calibration technique.

Figure 10:
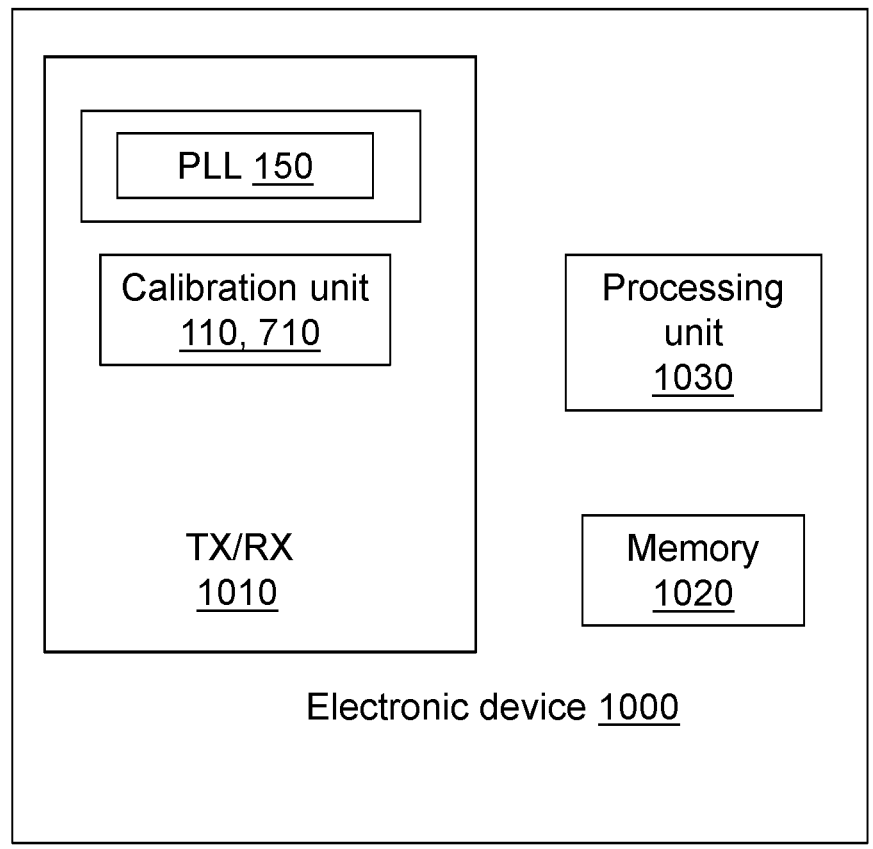
FIG. 10 is a block diagram illustrating an electronic device in which a calibration unit according to embodiments herein may be implemented.

The calibration unit 110, 710 together with the TDC 120 and DCO 130 in the PLL circuit 150 may be employed in various integrated circuits, electronic circuits, communication devices or apparatus. FIG. 10 shows a block diagram for an electronic device 1000 in which the calibration unit 110, 710 according to embodiments herein may be implemented. The electronic device 1000 may comprise a receiver or a transmitter or both i.e. a transceiver TX/RX 1010 in which the calibration unit 110, 710 according to embodiments herein may be implemented. The electronic device 1000 may comprise other units, where a memory 1020, a processing unit 1030 are shown. The electronic device 1000 may be any one of a base station, a wireless communication device such as a user equipment or a mobile device for a cellular communication system.

The word "comprise" or "comprising", when used herein, shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A method performed in a calibration unit for calibrating a Time to Digital Converter (TDC), wherein the TDC is configured to receive a signal with a reference frequency (FREF) and a signal from a Digital Controlled Oscillator (DCO), the method comprising:

receiving output data samples from the TDC for a predefined period of time;
performing a de-wrapping process on the data samples;
generating reference line segments from the data samples using a numerical fitting method;
calculating an error value for each of the output data samples associated to a TDC output level by calculating a deviation of each output data sample from a corresponding reference level of at least one reference line segment;
accumulating the error values of the data samples associated to a TDC output level in an accumulator of this TDC output level;
increasing a counter value of a TDC output level by one when an error value of a data sample associated with this TDC output level is added to its accumulator;
averaging the error values for each TDC output level by dividing the accumulated error value for each TDC output level in its accumulator by its counter value; and
generating a calibration lookup table comprising an error vector of the averaged error values for the TDC output levels.

2. The method of claim 1, wherein processing the data samples comprises:
estimating a TDC output level difference for a time period corresponding to one DCO cycle, and
adding or subtracting a staircase function with the estimated TDC output level difference to the data samples, so that the data samples for the predefined period of time are converted from a sawtooth shape to a single ramp of output levels.

3. A calibration unit for calibrating a Time to Digital Converter (TDC), wherein the TDC is configured to receive a signal with a reference frequency (FREF) and a signal from a Digital Controlled Oscillator (DCO), the calibration unit is configured to:

receive output data samples from the TDC for a predefined period of time;
perform a de-wrapping process on the data samples;
generate reference line segments from the data samples using a numerical fitting method;
calculate an error value for each of the output data samples associated to a TDC output level by calculating a deviation of each output data sample from a corresponding reference level of at least one reference line segment;
accumulate the error values of the data samples associated to a TDC output level in an accumulator of this TDC output level;
increase a counter value of a TDC output level by one when an error value of a data sample associated with this TDC output level is added to its accumulator;
average the error values for each TDC output level by dividing the accumulated error value for each TDC output level in its accumulator by its counter value; and
generate a calibration lookup table comprising an error vector of the averaged error values for the TDC output levels.

4. An electronic device comprising the calibration unit of claim 3.

5. The electronic device of claim 4, wherein the electronic device is a base station or a user equipment.

6. A method performed in a calibration unit for calibrating a Time to Digital Converter (TDC), wherein the TDC is configured to receive a signal with a reference frequency (FREF) and a signal from a Digital Controlled Oscillator (DCO) with a frequency (FDCO), wherein the DCO frequency FDCO is set to close to an integer multiple of the reference frequency FREF such that a number of ramps of output data samples from the TDC are generated, the method comprising:
- receiving output data samples from the TDC for a predefined period of time;
- detecting borders between ramps by observing if an output data sample has a large and abrupt transition compared to previous output data sample;
- for each ramp of the TDC output data samples,
- generating a reference line for the ramp using a numerical fitting method,
- calculating an error value for each of the output data samples associated with a TDC output level by calculating a deviation of each output data sample in a ramp from a corresponding reference level of the reference line of this ramp;
- accumulating the error values of the data samples associated with a TDC output level in an accumulator of this TDC output level;
- increasing a counter value of a TDC output level by one when an error value of a data sample associated with this TDC output level is added to its accumulator;
- when the ramps of the output data samples have been analyzed and the accumulators and counters have been updated,
- averaging the error values for each TDC output level by dividing the accumulated error value for each TDC output level in its accumulator by its counter value;
- generating a calibration lookup table comprising an error vector of the averaged error values for the TDC output levels.

7. A calibration unit for calibrating a Time to Digital Converter (TDC), wherein the TDC is configured to receive a signal with reference frequency FREF and a signal from a Digital Controlled Oscillator (DCO) with frequency FDCO, wherein the DCO frequency FDCO is set to close to an integer multiple of the reference frequency FREF such that ramps of output data samples from the TDC are generated, the calibration unit is configured to:
- receive output data samples from the TDC for a predefined period of time;
- detect borders between ramps by observing if an output data sample has a large and abrupt transition compared to previous output data sample;
- for each ramp of the TDC output data samples,
- generate a reference line for the ramp using a numerical fitting method,
- calculate an error value for each of the output data samples associated with a TDC output level by calculating a deviation of each output data sample in a ramp from a corresponding reference level of the reference line of this ramp;
- accumulate the error values of the data samples associated with a TDC output level in an accumulator of this TDC output level;
- increase a counter value of a TDC output level by one when an error value of a data sample associated with this TDC output level is added to its accumulator;
- when the ramps of the output data samples have been analyzed and the accumulators and counters have been updated,
- average the error values for each TDC output level by dividing the accumulated error value for each TDC output level in its accumulator by its counter value;
- generate a calibration lookup table comprising an error vector of the averaged error values for the TDC output levels.

* * * * *